United States Patent
Kondoh

(10) Patent No.: US 11,545,381 B2
(45) Date of Patent: Jan. 3, 2023

(54) SUBSTRATE TRANSPORTING METHOD AND SUBSTRATE PROCESSING SYSTEM

(71) Applicant: TOKYO ELECTRON LIMITED, Tokyo (JP)

(72) Inventor: Keisuke Kondoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1117 days.

(21) Appl. No.: 16/089,738

(22) PCT Filed: Feb. 23, 2017

(86) PCT No.: PCT/JP2017/008207
§ 371 (c)(1),
(2) Date: Sep. 28, 2018

(87) PCT Pub. No.: WO2017/169495
PCT Pub. Date: Oct. 5, 2017

(65) Prior Publication Data
US 2020/0312689 A1 Oct. 1, 2020

(30) Foreign Application Priority Data
Mar. 30, 2016 (JP) .............................. JP2016-068041

(51) Int. Cl.
*H01L 21/677* (2006.01)
*B25J 13/08* (2006.01)
(Continued)

(52) U.S. Cl.
CPC ........ *H01L 21/67742* (2013.01); *B25J 13/08* (2013.01); *B65G 49/061* (2013.01);
(Continued)

(58) Field of Classification Search
CPC ......... H01L 21/67742; H01L 21/67259; H01L 21/67778; H01L 21/68; H01L 21/682;
(Continued)

(56) References Cited

U.S. PATENT DOCUMENTS 5,189,351 A * 2/1993 Torii ...................... B25J 9/1692
318/632
5,775,000 A * 7/1998 Maekawa ......... H01L 21/68728
134/902

(Continued)

FOREIGN PATENT DOCUMENTS

JP 2017139249 A 8/2017
WO WO-9008016 A1 * 7/1990

*Primary Examiner* — Jarrett J Stark
(74) *Attorney, Agent, or Firm* — Nath, Goldberg & Meyer; Jerald L. Meyer; Tanya E. Harkins

(57) ABSTRACT

Provided is a substrate transferring method which is capable of accurately mounting a substrate at a desired rotation angle. In order to eliminate a misalignment of a wafer W in a rotational direction in a vacuum process chamber, which is caused by a variation in a transfer distance of the wafer W, the wafer W is mounted on a stage while being offset from the center of the stage in a load lock chamber and an angle of rotation of the wafer W with respect to a fork when a transfer arm receives the wafer W is changed.

7 Claims, 6 Drawing Sheets

(51) Int. Cl.
  *B65G 49/06* (2006.01)
  *H01L 21/67* (2006.01)
  *H01L 21/68* (2006.01)

(52) U.S. Cl.
  CPC .. *H01L 21/67259* (2013.01); *H01L 21/67778* (2013.01); *H01L 21/68* (2013.01); *H01L 21/682* (2013.01)

(58) Field of Classification Search
  CPC .......... H01L 21/68707; H01L 21/68764; B25J 13/08; B65G 49/061; B65G 49/067; B65G 49/068; B65G 47/904; B65G 2201/022; Y10S 414/141; Y10S 414/136
  See application file for complete search history.

(56) References Cited

U.S. PATENT DOCUMENTS

2010/0278623 A1* 11/2010 Blank ................ B25J 9/101
  192/139
2015/0249028 A1* 9/2015 Genetti ............ H01L 21/67754
  414/222.05
2016/0293467 A1* 10/2016 Caveney ........... H01L 21/67173

* cited by examiner

SUBSTRATE TRANSPORTING METHOD AND SUBSTRATE PROCESSING SYSTEM

This is a National Phase Application filed under 35 U.S.C. 371 as a national stage of PCT/JP2017/008207, filed Feb. 23, 2017, an application claiming the benefit of Japanese Application No. 2016068041, filed Mar. 30, 2016, the content of each of which is hereby incorporated by reference in its entirety.

TECHNICAL FIELD

The present disclosure relates to a substrate transporting method for transferring a substrate with a transfer arm, and a substrate processing system.

BACKGROUND

A substrate processing system for performing a predetermined process, for example, a film forming process or a plasma-based etching process which is a high temperature process, on a semiconductor wafer (hereinafter simply referred to as "wafer") as a substrate includes a plurality of process chambers and a transfer chamber connected to the process chambers. The wafer is loaded into and unloaded from each process chamber by a transfer arm disposed in the transfer chamber. Each process chamber includes a mounting table on which the wafer is mounted. In the following description, a portion integrally moving between nodes (inflection points) in the transfer arm will be referred to as a link, and a leading end of the transfer arm will be referred to as an end effector. Incidentally, a two-link type transfer arm refers to a transfer arm having two links, and a one-link type transfer arm refers to a transfer arm having a single link.

A conventional substrate processing system uses a two-link scalar type transfer arm or a frog leg type transfer arm. These transfer arms include a fork serving as an end effector for gripping a wafer, and two arm portions as links. The fork and the arm portions are provided independently of each other.

By the way, in recent years, as a process temperature of a wafer increases, the wafer is sometimes heated up to 700 degrees C. to 800 degrees C. inside a process chamber. In such a case, a fork and arm portions of a transfer arm are heated by heat radiated from the wafer heated at the high temperature, and bearings and driving belts built in the arm portions may be damaged by heat. In order to improve heat resistance by eliminating the bearings and the driving belts, a one-link type transfer arm including an end effector in which a fork and an arm portion are formed as a unit has been proposed by the present inventors (for example, see Patent Document 1). In such a one-link type transfer arm, the end effector transfers the wafer while gripping the wafer. When the transfer arm is extended, the end effector is rotated. Thus, the wafer held by the end effector is also rotated. In the meantime, in the substrate processing system, in order to accurately perform a predetermined process on a wafer, it is necessary to accurately mount the wafer on a mounting table at a desired rotation angle.

PRIOR ART DOCUMENT

Patent Document (Patent Document 1): Japanese Patent Application No. 2016-016863

However, in order to cope with a change in substantial wafer transfer distance caused by the thermal expansion of each component of the substrate processing system or cope with a change in wafer transfer distance caused by correction of displacement of the gripped wafer relative to the end effector, it may be necessary to change a transfer amount of the wafer, namely an extension amount of the transfer arm. In this case, due to the change in extension amount of the transfer arm, the wafer may be rotated in excess of a predetermined rotation angle, which may cause a problem in which the wafer cannot be accurately mounted on a mounting table at a desired rotation angle.

SUMMARY

The present disclosure provides some embodiments of a substrate transporting method and a substrate processing system, which are capable of accurately mounting a substrate at a desired rotation angle.

According to one embodiment of the present disclosure, there is provided a method of transferring a substrate in a substrate processing system including a transfer system that receives the substrate from a transfer source and transfers the substrate to a transfer destination, wherein the transfer system includes a gripping part for gripping the substrate and rotates the gripping part when the transfer system is extended to transfer the substrate, the method including: calculating a first misalignment of the substrate in a rotational direction in the transfer destination; and changing a rotation angle of the substrate with respect to the gripping part when the transfer system receives the substrate in the transfer source.

According to another embodiment of the present disclosure, there is provided a substrate processing system, including: a transfer system configured to receive a substrate from a transfer source and transfers the substrate to a transfer destination, and including a gripping part for gripping the substrate; and a control part, wherein the transfer system rotates the gripping part when the transfer system is extended to transfer the substrate, wherein the control part is configured to calculate a misalignment of the substrate in a rotational direction in the transfer destination, and to change a rotation angle of the substrate with respect to the gripping part when the transfer system receives the substrate in the transfer source.

According to the present disclosure, a rotation angle of a substrate with respect to a gripping part when a transfer system receives the substrate in a transfer source is changed so as to eliminate a misalignment of the substrate in a rotational direction in a transfer destination. As a result, it is possible to prevent the substrate from being misaligned in the rotational direction in the transfer destination, thus accurately mounting the substrate at a desired rotation angle in the transfer destination.

DETAILED DESCRIPTION

Embodiments of the present disclosure will now be described in detail with reference to the accompanying drawings.

Figure 1:
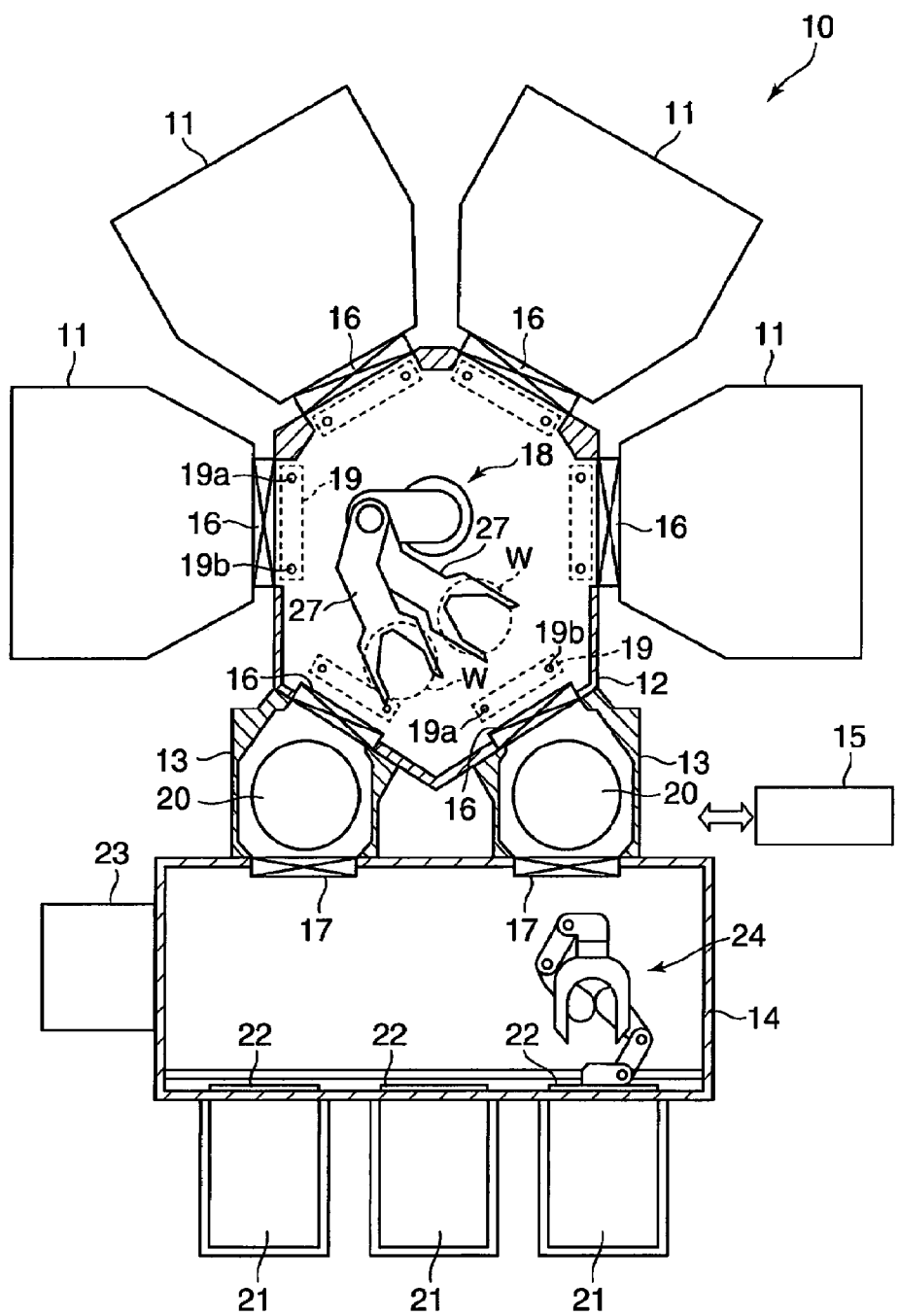
FIG. 1 is a plan view schematically illustrating the configuration of a substrate processing system according to an embodiment of the present disclosure.

FIG. 1 is a plan view schematically illustrating the configuration of a substrate processing system according to an embodiment. For the sake of convenience in description, FIG. 1 is shown such that some internal components are revealed.

The substrate processing system 10 includes four vacuum process chambers 11 (transfer destinations) in which a film forming process or a plasma etching process, which is a high temperature process, is performed, a vacuum transfer chamber 12 connected to the vacuum process chambers 11, two load lock chambers 13 (transfer sources) which are connected to the vacuum transfer chamber 12 and whose interiors can be switched between atmospheric pressure and a vacuum atmosphere, a loading/unloading chamber 14 connected to the vacuum transfer chamber 12 through the respective load lock chambers 13 and whose interior becomes atmospheric pressure, and a controller 15 (control part) which controls the operation of various components. Gates 16 are located between the vacuum process chambers 11 and the vacuum transfer chamber 12 and between the load lock chambers 13 and the vacuum transfer chamber 12. Gates 17 are located between the load lock chambers 13 and the loading/unloading chamber 14.

The vacuum transfer chamber 12 includes a one-link type transfer arm 18 (transfer system) for transferring a wafer W with respect to the vacuum process chambers 11 or the load lock chambers 13, and six sensor units 19 disposed in front of the respective gates 16. The transfer arm 18 has two end effectors 27 (to be described later) arranged to overlap each other. Each of the sensor units 19 includes two transmission type optical sensors 19a and 19b, and specifies a position of an edge of the wafer W transferred between the vacuum process chambers 11 and the load lock chambers 13 by the transfer arm 18 and a position of an edge of the transfer arm 18. Each of the load lock chambers 13 includes a stage 20 on which the wafer W is mounted, and delivers the wafer W between the vacuum transfer chamber 12 and the loading/unloading chamber 14. Each of the load lock chambers 13 may include a buffer plate for holding the wafer W instead of the stage 20. The loading/unloading chamber 14 includes three ports 22 as wafer loading/unloading ports to which containers 21 each of which accommodates a plurality of wafers W are respectively attached, an orienter 23 for rotating the wafer W to adjust a position of the wafer W, and an atmospheric transfer arm 24 for transferring the wafer W between the ports 22, the orienter 23 and the respective load lock chambers 13.

Figure 2A:
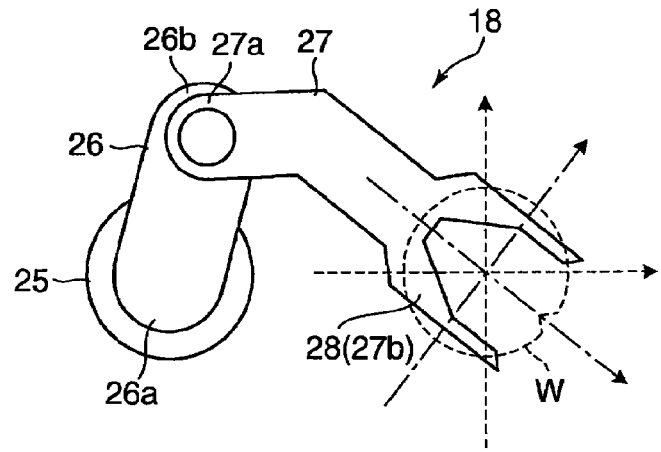
FIGS. 2A to 2C are plan views for explaining the configuration of a transfer arm in FIG. 1.
Figure 2B:
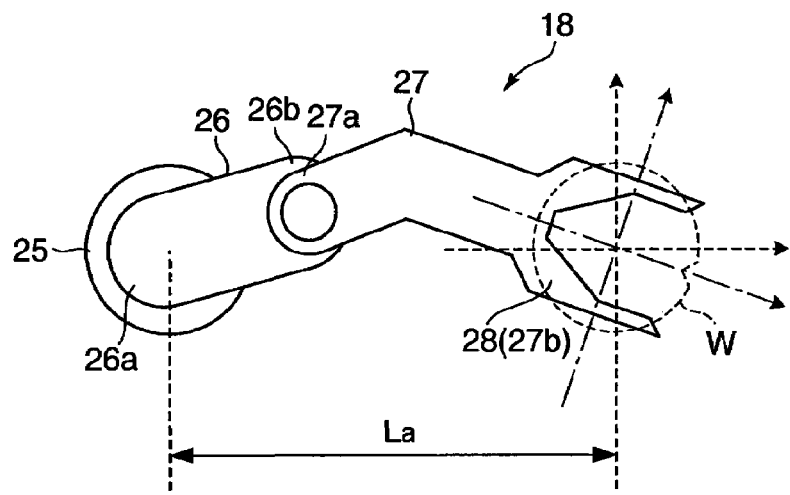
Figure 2C:
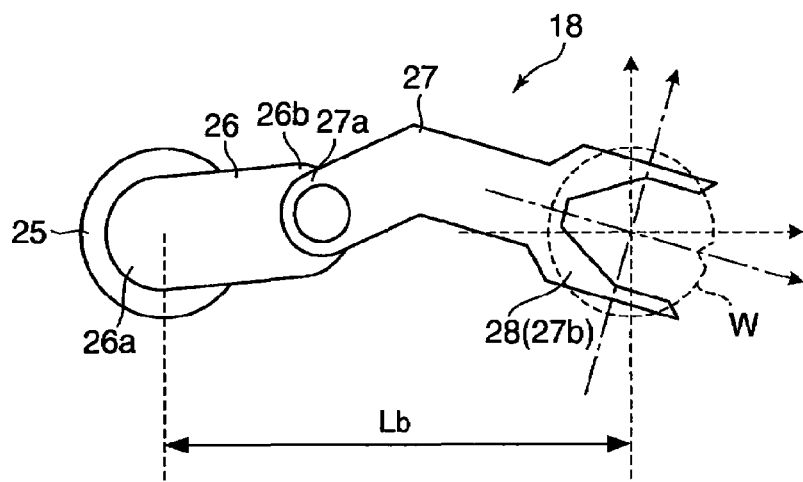

FIGS. 2A to 2C are plan views for explaining the configuration of the transfer arm in FIG. 1. FIG. 2A shows a state in which the transfer arm is contracted, FIG. 2B shows a state in which the transfer arm is extended, and FIG. 2C shows a state in which the transfer arm is further extended by a minute distance from the state of FIG. 2B.

In FIGS. 2A to 2C, the transfer arm 18 includes a cylindrical pedestal 25, an arm portion 26 and the two end effectors 27 arranged to overlap each other. In FIGS. 2A to 2C and subsequent figures, only one of the two end effectors 27 in the transfer arm 18 is shown. The arm portion 26 includes one end 26a attached to the pedestal 25 and is rotated horizontally around the central axis of the pedestal 25 by virtue of a built-in driving belt. The end effector 27 is formed of an elongated plate-like member which is curved en route, and includes one end 27a attached to the other end 26b of the arm portion 26. The other end 26b is formed in a semicircular shape. The end effector 27 is horizontally rotated around the central axis of the other end 26b of the arm portion 26 by virtue of a built-in driving belt. A bifurcated fork 28 (gripping part) for gripping the wafer W is formed at the other end 27b of the end effector 27. Further, the end effector 27 is made of a bulk material incorporating no mechanical mechanism, such as a heat resistant material such as ceramics.

The transfer arm 18 transfers the wafer W gripped by the fork 28 in a rectilinear direction (in a left-right direction in FIGS. 2A to 2C) while adjusting a rotation angle in cooperation between the arm portion 26 and the end effector 27. However, since the fork 28 and the end effector 27 are formed as a unit and the end effector 27 is rotated around the central axis of the other end 26b of the arm portion 26 in the course of transferring the wafer W, the fork 28 is also moved while being rotated. Accordingly, when the transfer arm 18 is extended, the transfer arm 18 rotates the fork 28. Further, when the transfer arm 18 is extended, the wafer W gripped by the fork 28 is also rotated. Specifically, as illustrated in FIGS. 2A and 2B, a coordinate system on the basis of the center of the fork 28 (hereinafter referred to as a "fork coordinate system") indicated by a dashed dotted line is rotated with respect to a coordinate system on the basis of the rectilinear direction of the wafer W (hereinafter referred to as a "rectilinear direction coordinate system") indicated by a broken line. As a result, the angle of rotation of the fork coordinate system with respect to the rectilinear direction coordinate system differs between the contraction state (FIG. 2A) and the extension state (FIG. 2B) of the transfer arm 18.

Figure 3:
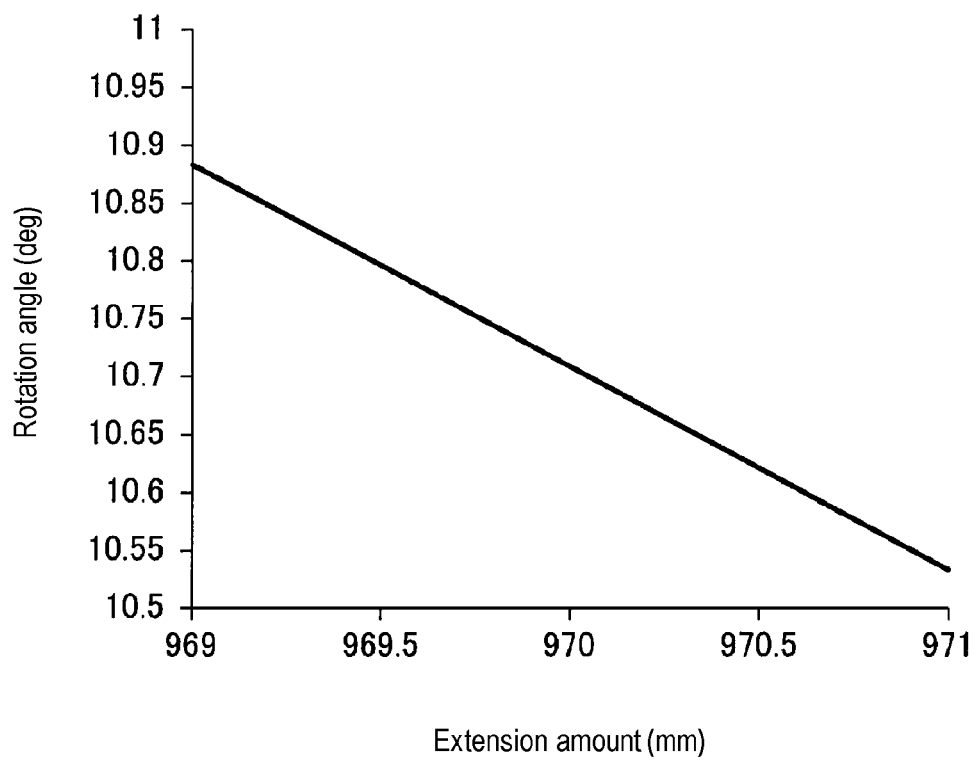
FIG. 3 is a graph showing a relationship between a rotation angle of a wafer and an extension amount of a transfer arm.

Incidentally, in the substrate processing system 10, the temperature of each component of the substrate processing system 10 is increased as a film forming process is repeatedly performed in each of the vacuum process chambers 11. This thermally expands each component. Thus, a distance from each load lock chamber 13 to each vacuum process chamber 11, namely a transfer distance of the wafer W, is changed. In a case where the wafer W is gripped by the fork 28 while being displaced on the fork 28, the displacement of the wafer W with respect to the fork 28 is calculated and subsequently, a transfer track of the wafer W is adjusted so as to correct the calculated displacement of the wafer W. Even in such a case, the transfer distance of the wafer W is changed. For example, when the amount of extension of the transfer arm 18 is slightly changed from La (see FIG. 2B) to Lb (see FIG. 2C) in order to cope with the change in the transfer distance of the wafer W, the fork 28 is slightly rotated with the slight change in the extension amount of the transfer arm 18 so that the wafer W gripped by the fork 28 is slightly rotated. For example, as illustrated in FIG. 3, when the extension amount is changed from La (969.5 mm) to Lb (970.5 mm), the rotation angle of the wafer W is changed from 10.79 (deg) to 10.62 (deg). As a result, the wafer W is mounted on a stage (not shown) of the vacuum process chamber 11, for example, in a state in which the wafer W is slightly rotated while being deviated from the desired rotation angle in the vacuum process chamber 11. That is to say, a deviation in the rotational direction of the wafer W occurs in the vacuum process chamber 11.

Figure 4:
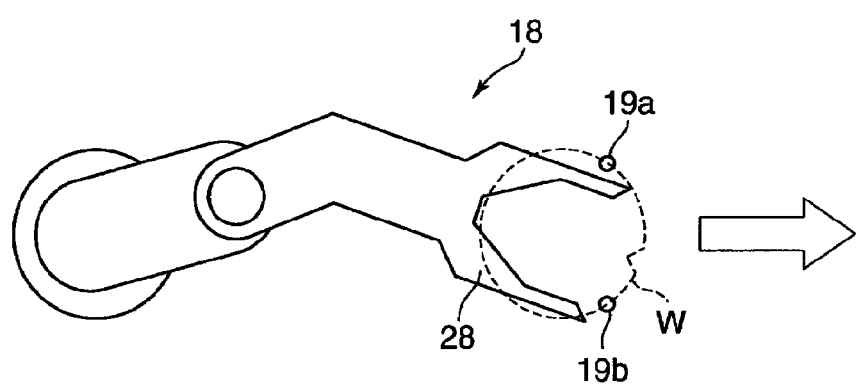
FIG. 4 is a view for explaining a method of calculating a displacement of a wafer with respect to a fork.

FIG. 4 is a view for explaining a method of calculating a misalignment of the wafer with respect to the fork.

In the substrate processing system 10, when the wafer W is loaded into the vacuum process chamber 11 by the transfer arm 18, the sensor unit 19 specifies a position of an edge of the wafer W. Specifically, in the course of transferring the wafer W, first, the sensor unit 19 specifies the position of the edge of the wafer W from a relative positional relationship between a position of the center of the fork 28 when the edge of the wafer W moves across a facing surface of the optical sensor 19a or the optical sensor 19b and a position of the optical sensor 19a or the optical sensor 19b. The position of the center of the fork 28 is calculated from an encoder value of the transfer arm 18. Thereafter, the position of the center of the wafer W is calculated from the specified position of the edge of the wafer W. The misalignment of the wafer W with respect to the fork 28 is calculated based on the position of the center of the wafer W and the position of the center of the fork 28.

Figure 5A:
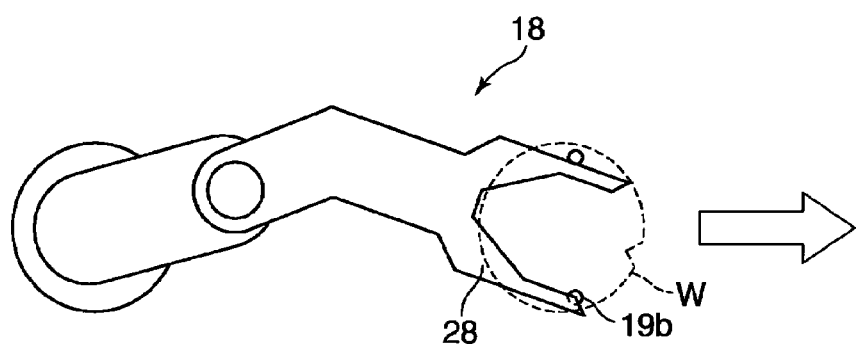
FIGS. 5A and 5B are views for explaining a method of calculating the amount of thermal expansion of each component of the substrate processing system.
Figure 5B:
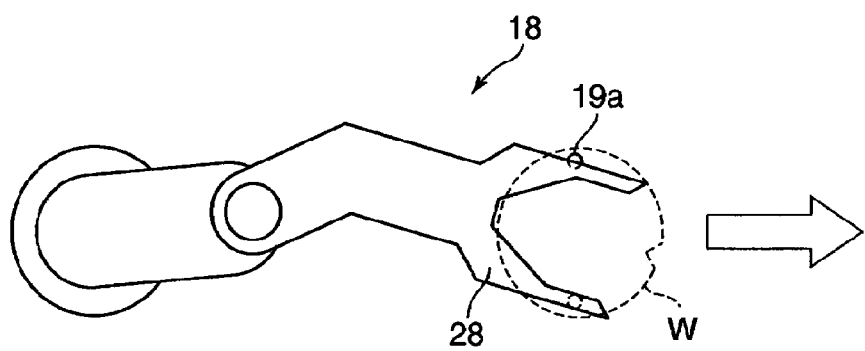

FIGS. 5A and 5B are views for explaining a method of calculating a thermal expansion amount of each component of the substrate processing system.

In the substrate processing system 10, when the wafer W is loaded into the vacuum process chamber 11 by the transfer arm 18 and when the wafer W is unloaded from the vacuum process chamber 11, the thermal expansion amount of each component is calculated. Specifically, in the course of transferring the wafer W by the transfer arm 18 which has been thermally expanded, first, the position of the edge of the fork 28 is specified when the edge of the end effector 27 (the fork 28) moves across a facing surface of the optical sensor 19b (FIG. 5A). At this time, the position of the edge of the fork 28 when it has not been thermally expanded is also specified from the encoder value of the transfer arm 18. Thereafter, the thermal expansion amount of the transfer arm 18 is calculated from a difference between the two specified positions of the edges. In addition, the position of the edge of the fork 28 is also specified when the edge of the fork 28 moves across a facing surface of the optical sensor 19a (FIG. 5B). Further, even at this time, the position of the edge of the fork 28 when it has not been thermally expanded is specified from the encoder value of the transfer arm 18. Thereafter, the thermal expansion amount of the transfer arm 18 is also calculated from a difference between the two specified positions of the edges. Thereafter, the thermal expansion amount of each component of the substrate processing system 10 is calculated from the two calculated thermal expansion amounts of the transfer arm 18. For example, an average value of the two calculated thermal expansion amounts of the transfer arm 18 is calculated as the thermal expansion amount of each component of the substrate processing system 10.

In the present embodiment, in order to eliminate a deviation in the rotational direction of the wafer W in the vacuum process chamber 11 (hereinafter referred to as a "transfer destination-side rotational direction deviation") which is caused by a change in the transfer distance of the wafer W accompanied by correction of the calculated misalignment of the wafer W with respect to the fork 28 and a change in the transfer distance of the wafer W corresponding to the calculated thermal expansion amount of each component of the substrate processing system 10, a rotation angle of the wafer W with respect to the fork 28 when the transfer arm 18 receives the wafer W in the load lock chamber 13 (hereinafter referred to as a "wafer rotation angle at the time of reception") is varied. The transfer destination-side rotational direction deviation is calculated from, for example, the relationship between the rotation angle of the wafer W and the extension amount of the transfer arm 18 shown in FIG. 3 based on the change in the transfer distance of the wafer W.

Figure 6A:
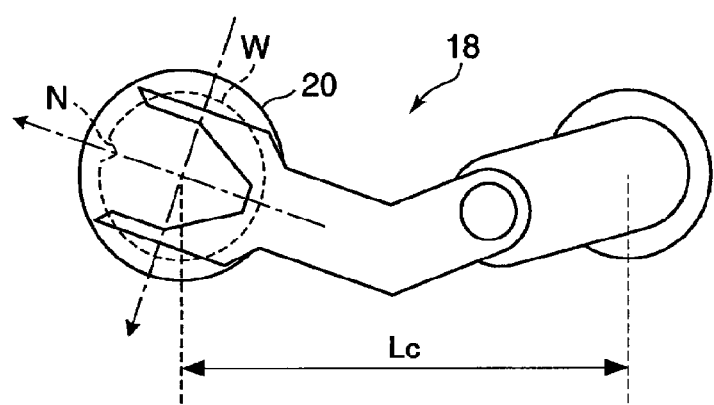
FIGS. 6A and 6B are views for explaining a method of changing the rotation angle of the wafer with respect to the fork when the transfer arm receives the wafer.
Figure 6B:
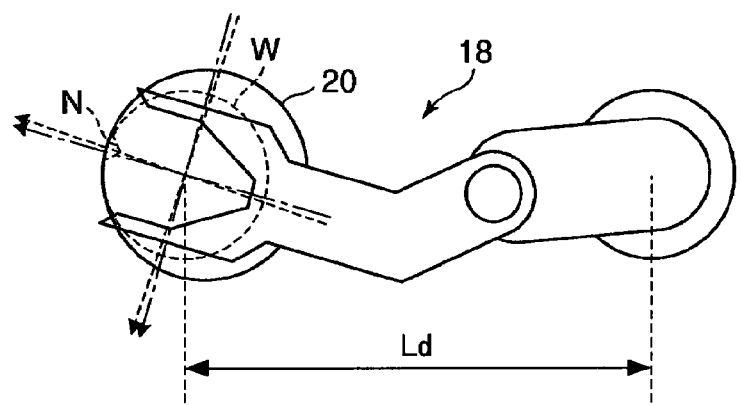

FIGS. 6A and 6B are views for explaining a method of changing the rotation angle of the wafer with respect to the fork when the transfer arm receives the wafer.

First, an extension amount of the transfer arm 18 required to receive the wafer W in the load lock chamber 13 when no thermal expansion of each component of the substrate processing system 10 occurs or no misalignment of the wafer W with respect to the fork 28 occurs, is referred to as "Lc". At this time, it is assumed that the wafer W is mounted on the center of the stage 20 in the load lock chamber 13, and the fork coordinate system coincides with a coordinate system on the basis of a notch N of the wafer W and the center of the wafer W (hereinafter referred to as a "wafer coordinate system") (FIG. 6A).

Thereafter, the wafer W, which is to be transferred later by the transfer arm 18, is mounted on the stage 20 by the atmospheric transfer arm 24. At this time, the atmospheric transfer arm 24 mounts the wafer W on the stage 20 while being offset from the center of the stage 20. An extension amount of the transfer arm 18 required to receive the wafer W offset from the center of the stage 20 is referred to as "Ld" which is different from Lc. As illustrated in FIG. 6B, the fork coordinate system (indicated by a dashed dotted line) is deviated from the wafer coordinate system (indicated by a broken line) in the rotational direction with a change in the extension amount of the transfer arm 18 (i.e., a change from Lc to Ld). The amount of deviation in the rotational direction at this time can be calculated based on the change in the extension amount of the transfer arm 18 and the relationship between the rotation angle of the wafer W and the extension amount of the transfer arm 18 shown in FIG. 3. In the present embodiment, by setting an absolute value of the deviation of the fork coordinate system relative to the wafer coordinate system in the rotation direction when the transfer arm 18 receives the wafer W offset from the center of the stage 20 to be equal to an absolute value of the transfer destination-side rotational direction deviation, and by setting a direction of the deviation of the fork coordinate system relative to the wafer coordinate system in the rotational direction to be coincide with a direction of the transfer destination-side rotational direction deviation, it is possible to eliminate the transfer destination-side rotational direction deviation when the wafer W is transferred into the vacuum process chamber 11.

According to the present embodiment, the wafer rotation angle at the time of reception in the load lock chamber 13 is changed so as to eliminate the transfer destination-side rotational direction deviation. This makes it possible to prevent the wafer W from being misaligned in the rotational direction in the vacuum process chamber 11. It is therefore possible to accurately mount the wafer W on the stage at a desired rotation angle in the vacuum process chamber 11.

In addition, in the present embodiment, since the wafer rotation angle at the time of reception is changed by changing the extension amount of the transfer arm 18 when the transfer arm 18 receives the wafer W in the load lock chamber 13, there is no need to change the rotation angle of the wafer W when the wafer W is mounted on the stage 20. This eliminates the need to install a rotation mechanism for rotating the wafer W in the stage 20 or the atmospheric transfer arm 24, thereby preventing the configuration of the substrate processing system 10 from becoming complicated.

Further, in some embodiments, the wafer rotation angle at the time of reception may be changed only when the calculated transfer destination-side rotational direction deviation exceeds an allowable value. This makes it possible to prevent the change of the rotation angle of the wafer W in the load lock chamber 13 from being frequently executed, thereby preventing degradation in throughput of transfer of the wafer W.

Further, in the present embodiment, the rotation angle of the wafer is changed in the load lock chamber 13, not in the orienter 23, so as to eliminate the transfer destination-side rotational direction deviation. That is to say, the rotation angle of the wafer is changed immediately before the transfer of the wafer W by the transfer arm 18. Therefore, for example, even when an additional process is applied while the wafer W is being transferred from the orienter 23 to the load lock chamber 13, the accuracy of change in the rotation angle of the wafer for eliminating the transfer destination-side rotational direction deviation does not deteriorate. As a result, it is possible to increase a degree of freedom of design in the transfer process of the wafer W.

Although the present disclosure has been described by way of embodiments, the present disclosure is not limited to the above-described embodiments.

For example, although the misalignment of the wafer W relative to the fork 28 and the thermal expansion amount of the transfer arm 18 have been described to be calculated using the sensor unit 19, a camera may be installed inside the vacuum transfer chamber 12 to calculate the misalignment of the wafer W relative to the fork 28 and the thermal expansion amount of the transfer arm 18 by specifying a position of the edge of the wafer W which is being transferred or a position of the edge of the fork 28. Further, the thermal expansion amount of the transfer arm 18 may be calculated by measuring the temperature of the transfer arm 18 with a non-contact temperature sensor.

Figure 7:
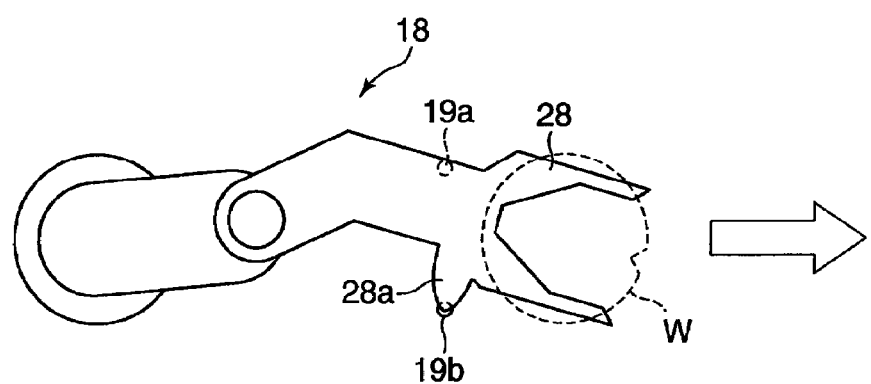
FIG. 7 is a plan view for explaining the configuration of a modification of the transfer arm.

Further, the fork 28 is mostly covered by the wafer W when gripping the wafer W. Thus, it is somewhat difficult to specify the position of the edge of the fork 28 with the sensor unit 19. To address this, as shown in FIG. 7, a protrusion 28a may be formed in the fork 28 so as not to be covered by the wafer W and the thermal expansion amount of the transfer arm 18 may be calculated by specifying the edge of the protrusion 28a with the sensor unit 19. This makes it possible to prevent an error from occurring in calculating the thermal expansion amount of the transfer arm 18.

Further, in the above-described embodiment, the wafer rotation angle at the time of reception has been described to be changed by changing the extension amount of the transfer arm 18. However, a rotation mechanism of the wafer W may be installed in the stage 20 or the atmospheric transfer arm 24, and the wafer rotation angle at the time of reception may be changed by rotating the wafer W with the rotation mechanism to place the wafer W on the stage 20.

Further, although the transfer arm 18 is a one-link type transfer arm in the above embodiment, the transfer arm 18 may be a two-link scalar type or frog leg type transfer arm. The present disclosure can be applied to such a case as long as the two-link scalar type or the frog leg type transfer arm can be rotated to transfer the wafer W.

Moreover, the present disclosure may be achieved by providing a memory medium that stores a program code of a software for implementing respective functions of the above embodiments to a computer of the controller 15 or the like, and by allowing a central processing unit of the computer to read and execute the program code stored in the memory medium.

In such a case, the program code itself which read from the memory medium implements the respective functions of the above embodiments, and the program code and the memory medium that stores the program code constitute the present disclosure.

In addition, examples of the memory medium for providing the program code may include RAM, NV-RAM, a floppy (registered mark) disk, a hard disk, an optomagnetic disk, an optical disk such as CD-ROM, CD-R, CD-RW and DVD (DVD-ROM, DVD-RAM, DVD-RW, DVD+RW), a magnetic tape, a nonvolatile memory card, and other ROMs, which are capable of storing the program code. Alternatively, the program code may be provided to the computer by downloading from another computer and database (both not shown) which are connected to an internet, a commercial network, a local area network or the like.

Further, the respective functions of the above embodiments may be implemented by executing the program code which is read by the computer, and by allowing an OS (operating system) running on the CPU to execute some or all of the actual processes based on an instruction of the program code.

Further, the respective functions of the above embodiments may be implemented by writing the program code read from the memory medium into a memory provided in a function expansion board inserted into the computer or a function expansion unit connected to the computer, and by allowing a CPU or the like provided in the function expansion board or the function expansion unit to execute some or all of the actual processes based on an instruction of the program code.

The program code may be configured in a form such as an object code, a program code executed by an interpreter, a script data provided to the OS, or the like.

This application is based upon and claims the benefit of priority from Japanese Patent Application No. 2016-068041, filed on Mar. 30, 2016, the entire contents of which are incorporated herein by reference.

EXPLANATION OF REFERENCE NUMERAL

W: wafer
10: substrate processing system
11: vacuum process chamber
13: load lock chamber
18: transfer arm
20: stage
27: end effector
28: fork

What is claimed is:

1. A method of transferring a substrate in a substrate processing system including a transfer system that receives the substrate from a transfer source and transfers the substrate to a transfer destination, wherein the transfer system includes a gripping part for gripping the substrate and rotates the gripping part when the transfer system is extended to transfer the substrate, the method comprising:

calculating a change in transfer distance of the substrate;
calculating a first misalignment of the substrate in a rotational direction in the transfer destination based on the change in transfer distance of the substrate, the first misalignment being a deviation of a rotation angle of the substrate from a reference rotation angle of the substrate in the transfer destination caused by the change in transfer distance of the substrate; and changing a rotation angle of the substrate with respect to the gripping part when the transfer system receives the substrate in the transfer source, based on the first misalignment.

2. The method of claim 1, wherein the changing a rotation angle of the substrate is performed when the calculated first misalignment of the substrate in the rotational direction exceeds an allowable value.

3. The method of claim 1, wherein the changing a rotation angle of the substrate includes changing an amount of extension of the transfer system when the transfer system receives the substrate in the transfer source.

4. The method of claim 3, wherein the calculating a second misalignment of the substrate includes calculating a misalignment of the substrate in the rotational direction in the transfer destination, which is caused by changing the amount of extension of the transfer system in the changing an amount of extension of the transfer system so as to cope with the change in transfer distance of the substrate caused by a thermal expansion of each component of the substrate processing system.

5. The method of claim 3, wherein the calculating a third misalignment of the substrate includes calculating a misalignment of the substrate in the rotational direction in the transfer destination, which is caused by changing the amount of extension of the transfer system in the changing an amount of extension of the transfer system so as to cope with the change in transfer distance of the substrate caused by correcting a displacement of the substrate relative to the gripping part.

6. The method of claim 1, wherein the transfer system is a one-link transfer arm having a single link.

7. A substrate processing system, comprising:

a transfer system configured to receive a substrate from a transfer source and transfers the substrate to a transfer destination, and including a gripping part for gripping the substrate; and a control part, wherein the transfer system rotates the gripping part when the transfer system is extended to transfer the substrate, and wherein the control part is configured to:
calculate a change in transfer distance of the substrate;
calculate a misalignment of the substrate in a rotational direction in the transfer destination based on the change in transfer distance of the substrate, the misalignment being a deviation of a rotation angle of the substrate from a reference rotation angle of the substrate in the transfer destination caused by the change in transfer distance of the substrate; and
change a rotation angle of the substrate with respect to the gripping part when the transfer system receives the substrate in the transfer source, based on the misalignment.

* * * * *